(12) United States Patent
Xu et al.

(10) Patent No.: US 8,536,637 B2
(45) Date of Patent: Sep. 17, 2013

(54) ARRAY ARCHITECTURE FOR EMBEDDED FLASH MEMORY DEVICES

(75) Inventors: Daniel Xu, Shanghai (CN); Roger Lee, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/959,279

(22) Filed: Dec. 2, 2010
(Under 37 CFR 1.47)

(65) Prior Publication Data

US 2011/0298032 A1    Dec. 8, 2011

(30) Foreign Application Priority Data

Dec. 4, 2009    (CN) .......................... 2009 1 0199993

(51) Int. Cl.
*H01L 29/788*    (2006.01)
(52) U.S. Cl.
USPC ........... 257/315; 257/239; 257/314; 257/261; 438/201; 438/211; 438/257; 438/593; 365/185.01
(58) Field of Classification Search
USPC ................. 257/239, 314–323, 261, E29.129, 257/E29.3–E29.308, E21.179, E21.422, E21.267, 257/E21.68, E21.694; 438/201, 211, 257–267, 438/593–94; 365/185.01–185.33, 182, 184–188
See application file for complete search history.

(56) References Cited

U.S. PATENT DOCUMENTS

| | | | | |
|---|---|---|---|---|
| 6,037,223 | A * | 3/2000 | Su et al. | 438/257 |
| 6,297,097 | B1 * | 10/2001 | Jeong | 438/264 |
| 6,833,299 | B2 * | 12/2004 | Coolbaugh et al. | 438/238 |
| 2004/0057286 | A1 * | 3/2004 | Chen et al. | 365/185.17 |
| 2004/0188759 | A1 * | 9/2004 | Contin et al. | 257/343 |
| 2009/0273015 | A1 * | 11/2009 | Lojek | 257/316 |

FOREIGN PATENT DOCUMENTS

CN    1577869 A    9/2005

\* cited by examiner

*Primary Examiner* — Steven Loke
*Assistant Examiner* — Cuong B Nguyen
(74) *Attorney, Agent, or Firm* — Kilpatrick Townsend and Stockton LLP

(57) ABSTRACT

A method for manufacturing Flash memory devices includes forming a well region in a substrate, depositing a gate dielectric layer overlying the well region, and depositing a first polysilicon layer overlying the gate dielectric layer. The method also includes depositing a dielectric layer overlying the first polysilicon layer and depositing a second polysilicon layer overlying the dielectric layer to form a stack layer. The method simultaneously patterns the stack layer to form a first flash memory cell, which includes a first portion of the second polysilicon layer overlying a first portion of the dielectric layer overlying a first portion of first polysilicon layer and to form a select device, which includes a second portion of second polysilicon layer overlying a second portion of dielectric layer overlying a second portion of first polysilicon layer. The method further includes forming source/drain regions using ion implant. The select device is activated by applying voltage to the second portion of first polysilicon layer.

19 Claims, 3 Drawing Sheets

ARRAY ARCHITECTURE FOR EMBEDDED FLASH MEMORY DEVICES

CROSS-REFERENCES TO RELATED APPLICATIONS

This application claims priority to Chinese Patent Application No. 200910199993.9, filed Dec. 4, 2010, which is commonly owned and incorporated by reference herein for all purposes.

BACKGROUND OF THE INVENTION

Embodiments of the present invention generally relate to integrated circuits and their processing for the manufacture of semiconductor devices. More particularly, embodiments of the present invention provide a method and architecture for manufacturing a memory device including a flash memory device, which can be embedded in other applications. For example, embodiments of the invention can be applied to embedded flash memory designs on logic, digital signal processing, microprocessor, micro-controller, and others devices.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence of absence of charge on the floating gate. The charge is generally sufficient to prevent conduction even when a normal high signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet (UV) erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable and programmable read-only memory ("EEPROM" or "E$^2$PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Various types of Flash cells have been proposed and utilized in the semiconductor industry. As merely an example, a split gate structure includes a floating gate, a control gate, and an additional gate known as a select gate. In the split gate structure, the control gate is disposed on top of the floating gate and insulated from it through a dielectric layer. Because of the select gate, the split gate structure is generally larger than a stack-gate structure. For example, the split gate structure has been used by companies such as Silicon Storage Technology, Inc. Unfortunately, a memory cell using a split gate structure cell is often difficult to shrink beyond a certain critical dimension such as 0.25 micron and below. These and other limitations of the conventional split gate cell have been described throughout the present specification and more particularly below.

From the above, it is seen that an improved technique for processing semiconductor devices is desired.

BRIEF SUMMARY OF THE INVENTION

According to embodiments of the present invention, techniques including methods for the manufacture of semiconductor devices are provided. More particularly, embodiments of the invention provide a method and device for manufacturing a memory device including a Flash Memory device, which can be embedded in other applications. For example, embodiments of the invention can be applied to embedded Flash Memory designs on logic, digital signal processing, microprocessor, micro-controller, and others devices.

In a specific embodiment, the invention provides a method for manufacturing memory devices, e.g., Flash memory device. The method includes forming a well region in a substrate, e.g., silicon wafer. The method forms a first polysilicon layer overlying the well region in the substrate and forms a dielectric layer overlying the first polysilicon layer. The method includes depositing a second polysilicon layer overlying the dielectric layer to form a stack layer; the stack layer including the first polysilicon layer, the dielectric layer, and the second polysilicon layer. The method simultaneously patterns the stack layer to form a flash memory device structure, the flash memory device structure including a first portion of the second polysilicon layer overlying a first portion of the dielectric layer, which overlies a first portion of the first polysilicon layer and to form a select device, the select device including a second portion of the second polysilicon layer overlying a second portion of the dielectric layer, which overlies a second portion of the first polysilicon layer. In an embodiment, the select device can be activated by applying a voltage to the second portion of the first polysilicon layer. Preferably, the method forms an electrical connection between the second portion of the second polysilicon layer and the second portion of the first polysilicon layer for the select device, while maintaining isolation between the first portion of the second polysilicon layer and the first portion of the first polysilicon layer for the first flash memory device.

In an alternative specific embodiment, the invention provides a semiconductor integrated circuit memory device structure, e.g., Flash memory cell. The structure includes a semiconductor substrate, e.g., silicon wafer. The structure also includes a well region in a substrate and a dielectric layer formed over the well region. A flash memory device structure is formed overlying a first portion of the dielectric layer. The flash memory device structure further includes a first portion of a second polysilicon layer overlying a first portion of the dielectric layer overlying a first portion of a first polysilicon layer. The structure also includes a select device formed over a second portion of the dielectric layer. In an embodiment, the select device may be coupled to the flash memory device structure through a source/drain region. In another embodiment, the select device may include a second portion of the second polysilicon layer overlying a second portion of the dielectric layer, which overlies a second portion of the first polysilicon layer. The structure further includes a contact region that electrically couples the second portion of the second polysilicon layer to the second portion of the first polysilicon layer.

In a specific embodiment, the flash device has a tunnel oxide layer between the first portion of the first polysilicon layer and the well region, and the select device has a gate oxide layer between the second portion of the first polysilicon layer and the well region. Depending on the embodiment, the gate oxide may have a different thickness than the tunnel oxide.

Many benefits can be achieved by way of the present invention over conventional techniques. For example, embodiments of the present technique provide an easy to use process that relies upon conventional technology. In some embodiments, the method provides higher device yields in dies per wafer. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

DETAILED DESCRIPTION OF THE INVENTION

According to embodiments of the present invention, techniques including methods for the manufacture of semiconductor devices are provided. More particularly, embodiments of the invention provide a method and structure for manufacturing a memory device including a Flash Memory device, which can be embedded in other applications. For example, the invention can be applied to embedded Flash Memory designs on logic, digital signal processing, microprocessor, micro-controller, and others devices.

Figure 1:
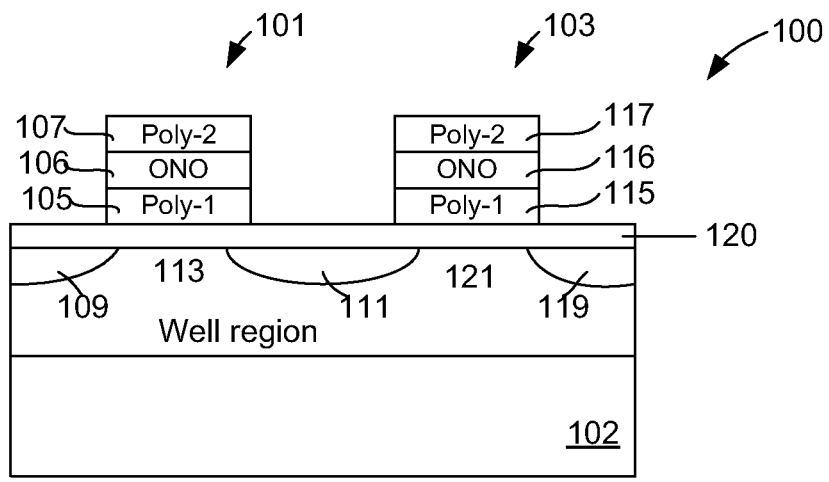
FIG. 1 is a simplified side-view diagram of a Flash memory device according to an embodiment of the present invention.

FIG. 1 is a simplified side-view diagram 100 of a Flash memory device according to an embodiment of the present invention. This diagram is merely an example, which should not unduly limit the scope of the claims herein. One of ordinary skill in the art would recognize many other variations, modifications, and alternatives. As shown, the side-view diagram includes a semiconductor substrate 102, e.g., a silicon substrate and an oxide layer 120 overlying the substrate. A well region is formed in the substrate. The diagram also includes a select gate structure 101 and a Flash memory device 103, which overlie the oxide layer. The select gate structure includes a first polysilicon layer 105 defined by poly-1 and an overlying second polysilicon layer 107 defined by poly-2. The first polysilicon layer may be electrically connected to the second polysilicon layer, where an oxide on nitride on oxide ("ONO") structure 106 is interposed between the first and second polysilicon layers. Further details of the electrical connection are provided throughout the present specification and more particularly below. The select gate is defined between active regions, including a source/drain region 109 and a source/drain region 111, which couple to each other via a channel region 113. In an embodiment, source/drain region 111 is common to the select device and Flash memory device 103, which also includes the double polysilicon layers.

The Flash memory device includes a floating gate 115 defined by poly-1 and an overlying control gate 117 defined by poly-2. An ONO layer 116 is interposed between the floating gate and the control gate, as shown. The Flash device also included source/drain region 111 and a source/drain region 119, which coupled to each other through a channel region 121. The present gate structure is commonly called an "ETOX" gate structure, but can also be others. The channel region can include a length of 0.18 microns and less, and 0.15 microns and less, as well as other dimensions. Each of the devices is formed on the gate oxide layer overlying the semiconductor substrate. In an embodiment, the semiconductor substrate can be a silicon wafer or any other suitable material.

In an embodiment, the floating gate (i.e., the first polysilicon layer) has a thickness of about 1000 Angstroms to about 2000 Angstroms; the dielectric layer has a thickness of about 50 Angstroms to about 200 Angstroms; and the control gate (i.e., the second polysilicon layer) has a thickness of about 1500 Angstroms to about 2500 Angstroms.

In some embodiments, the flash device includes a tunnel oxide layer between the first portion of the first polysilicon layer and the well region and the select device includes a gate oxide layer between the second portion of the first polysilicon layer and the well region. Although the tunnel oxide and gate oxide are both shown as layer 120 in FIG. 1, these oxides can have difference thicknesses, depending on the embodiments. In some embodiments, the gate oxide may be thicker than the tunnel oxide. In other embodiments, the gate oxide can be thinner than the tunnel oxide.

In operation, a voltage is applied to poly 1 of the select gate, which causes the voltage to be applied to source/drain region 111. Alternatively, poly 1 and poly 2 in the select gate are electrically connected to each other. Accordingly, the voltage may also be applied to poly 2 of the select gate, which provides the same voltage potential to poly 1 of the select gate. That is, poly 1 and poly 2 are connected to each other electrically. The Flash device operates in a conventional manner. Further details of the present invention are found throughout the present specification and more particularly below.

Figure 2:
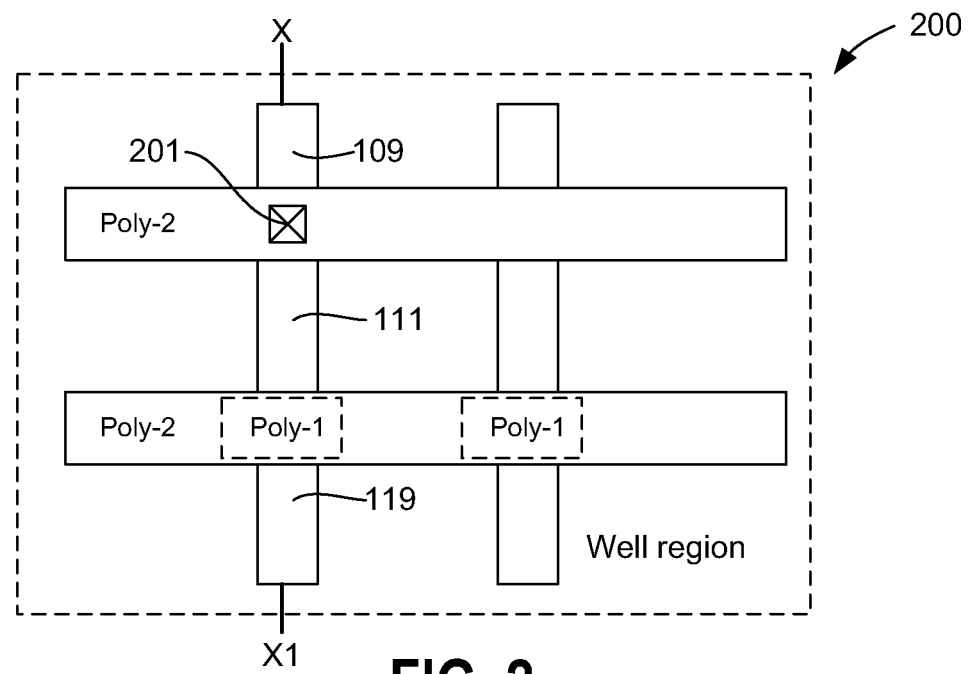
FIG. 2 is a simplified top-view diagram of a Flash memory device according to an embodiment of the present invention.

FIG. 2 is a simplified top-view diagram 200 of a Flash memory device according to an embodiment of the present invention. This diagram is merely an example, which should not unduly limit the scope of the claims herein. One of ordinary skill in the art would recognize many other variations, modifications, and alternatives. As shown, the top-view diagram includes active regions, including source/drain regions 111, 119. Active regions along a first direction couple into a plurality of active regions along a second direction. The first direction is perpendicular to the second direction. The top-view diagram also includes a plurality of poly-2 lines, which run perpendicular to the active regions. After stack etch, poly-2 runs along a length through active and inactive regions. Poly-2 also electrically connects to polysilicon 1 at an end region or multiple regions or other region. As also shown, the cross-sectional view of FIG. 1 has been made along line X-X1. Each of the flash memory devices is shown. Additionally, the poly 1 and 2 lines are connected to each other via connection 201, which is one of a plurality of such connections, which electrically connect the two lines together, according to a preferred embodiment.

Figure 3:
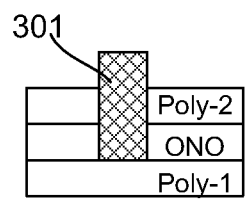
FIG. 3 is a simplified side-view diagram of a portion of a Flash memory device showing a gate stack in a select device according to an embodiment of the present invention.

FIG. 3 is a simplified side-view diagram of a connection region between poly-1 and poly 2 according to an embodiment of the present invention. This diagram is merely an example, which should not unduly limit the scope of the claims herein. One of ordinary skill in the art would recognize many other variations, modifications, and alternatives. As shown, poly-1 connects to poly-2 using a plug structure 301, which couples each of these layers together. The ONO structure is also shown but is not interfering with the plug structure. Depending upon the embodiment, there can be a plurality of these plug structures, which do not or do interfere with the ONO layer depending upon the embodiment. In an embodiment, the plug structure can be made of tungsten, polysilicon, or other suitable materials.

A method according to an embodiment of the present invention may be outlined as follows:

1. Provide a semiconductor substrate, e.g., a silicon wafer;
2. Form a well region in the substrate;
3. Form field isolation regions (e.g., LOCOS, STI);
4. Form a gate dielectric layer overlying the well region;
5. Deposit a first polysilicon layer overlying the gate dielectric layer;
6. Deposit a first oxide layer overlying the first polysilicon layer;
7. Deposit a nitride layer overlying the oxide layer;
8. Deposit a second oxide layer overlying the nitride layer, where the ensemble of the first oxide layer, the nitride layer and the second oxide layer forms an oxide-on-nitride-on-oxide ("ONO") layer;
9. Deposit a second polysilicon layer overlying the ONO layer, thereby the first polysilicon layer, the ONO layer, the second polysilicon layer form a stack layer;
10. Pattern the stack layer to form a flash memory cell and a select device, the patterning step may include a photolithography and an etching process;
11. Form source/drain regions using ion implantation;
12. Deposit an inter-metal layer dielectric material overlying the patterned stack layer and the source/drain regions;
13. Form an opening through the inter-metal layer dielectric material overlying the select device;
14. Fill the opening with a conducting material to connect the first polysilicon layer and the second polysilicon layer of the select device; and
15. Perform other steps, as desired.

The above sequence of steps is a method according to an embodiment of the present invention. As shown, the method provides processing steps of forming a select device coupled to a memory device, which has improved packing features. The memory device is an ETOX type memory structure, which can be packed in an array structure that is much denser than conventional split gate structures. Further details are provided throughout the present specification and more particularly below.

Figure 4:
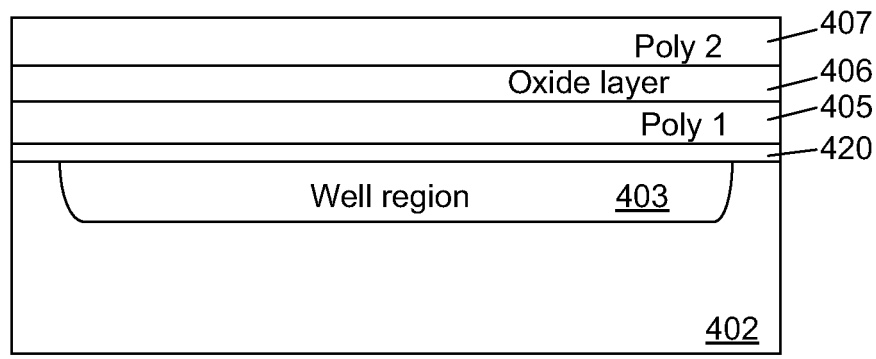
FIGS. 4 through 7 illustrate methods of fabricating a Flash memory device according to embodiments of the present invention.
Figure 5:
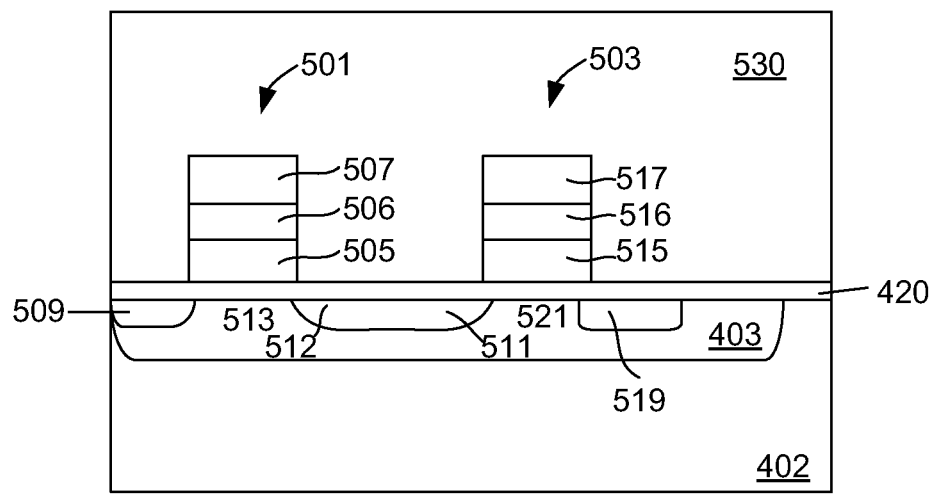
Figure 6:
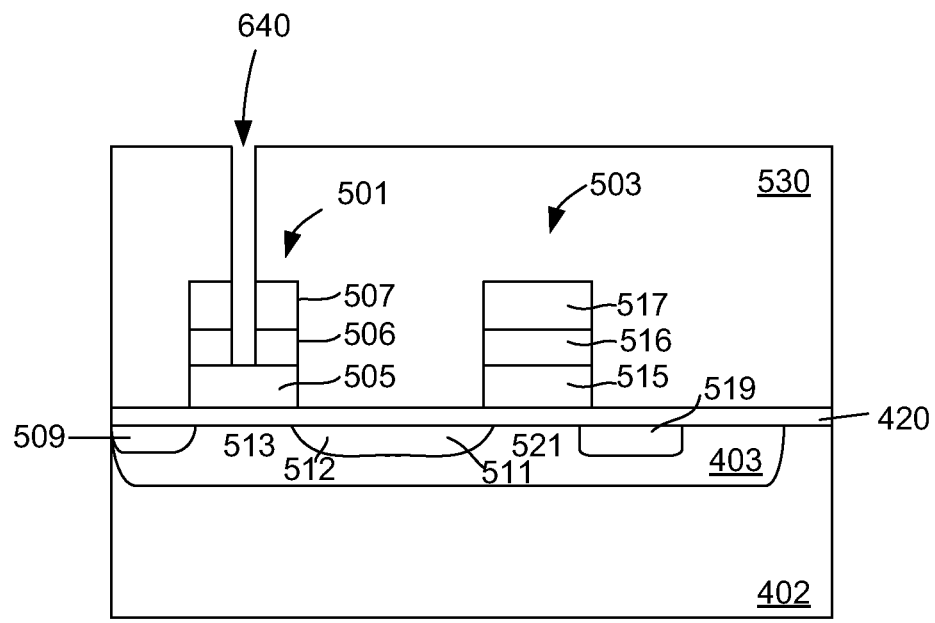

FIGS. 4 through 6 illustrate methods of fabricating a Flash memory device according to embodiments of the present invention. These diagrams are merely examples, which should not unduly limit the scope of the claims herein. One of ordinary skill in the art would recognize many other variations, modifications, and alternatives. As shown, the method begins by providing a substrate 402, e.g., semiconductor wafer. Preferably, the substrate is a silicon wafer. Well region 403 are formed within the substrate. The well region can include P-type type impurities or N-type impurities, depending upon the application.

The method forms field isolation regions (not shown) within the substrate. The field isolation regions can be formed using a variety of techniques such as local oxidation of silicon, commonly called LOCOS, alternatively, isolation regions can be formed using trench isolation structures. A surface of the silicon wafer is exposed and cleaned before the formation of a gate dielectric layer 420. The gate dielectric layer is formed overlying the surface of the substrate. The gate dielectric layer can be a high quality oxide layer, a silicon oxynitride layer, silicon nitride layer, any combination of these, and the like.

The method forms a stack layer, including a first polysilicon layer 405, an oxide layer 406, and a second polysilicon layer 407. Here, the method forms the first polysilicon layer overlying the gate dielectric layer. The polysilicon layer is preferably doped using implantation, diffusion, or other techniques. More preferably, the polysilicon layers are in-situ doped with an impurity having a concentration of about $10^{20}$ atoms/cm3 depending upon the embodiment. The impurity can be phosphorous and/or arsenic and the like. The method forms an overlying oxide layer 406 overlying the first polysilicon layer. In an embodiment, the oxide layer includes forming a first oxide layer overlying the dielectric layer, and forming a nitride layer over the first oxide layer. The method further includes forming a second oxide layer over the nitride layer to form an oxide-nitride-oxide (ONO) layer. The first polysilicon layer, the ONO layer and the second polysilicon layer form a stack layer that is then patterned and etched to obtain a select device 501 and a flash memory device 503 as shown in FIG. 5. The flash memory device includes a first portion 517 of the second polysilicon layer overlying a first portion 516 of the dielectric layer overlying a first portion 515 of the first polysilicon layer. In an embodiment, the select device includes a second portion 507 of the second polysilicon layer overlying a second portion 506 of the dielectric layer overlying a second portion 505 of the first polysilicon layer. Each second portion of the first and second polysilicon layers in the select device has an electrical conductivity or resistivity.

Referring to FIG. 5, ion implantation can be performed to form a drain region 509 and a source region 512 for the select device and a drain region 511 and a source region 519 for the flash memory device. In an embodiment, the source region of the select device and the drain region of the flash memory device share a common doped region. A channel region 513 underneath the select device couples the source/drain regions 509, 512; and a channel region 521 underneath the flash memory device couples the source/drain regions 511, 519. In an embodiment, the ion implant can be performed with Phosphorous (P) ions having a dose of about 10E12 to 10E14 ions/cm2 with an energy of 40 to 80 keV. An inter-metal layer dielectric material 530 such as silicon oxide or other electrical insulating material with suitable etching and planarization properties is then formed over the well region and the select device and the flash memory device. In an embodiment, the channel regions can include a length of 0.18 microns and less, and 0.15 microns and less, as well as other dimensions.

In a specific embodiment, the oxide layer 420 has a thickness of 100 Angstroms; the first polysilicon layer has a thickness of 1000 to about 2000 Angstroms, preferably 1500 Angstroms, the ONO layer has a thickness of about 200 Angstroms, and the second polysilicon layer has a thickness of about 1500 Angstroms to about 2500 Angstroms, and preferably 2000 Angstroms. In another embodiment, the inter-metal layer dielectric material has a thickness ranging from about 3000 Angstroms to about 6000 Angstrom measuring from a surface of the gate dielectric layer 420. In yet another embodiment, the inter-metal layer dielectric material has a thickness ranging from about 400 Angstroms to about 3000 Angstroms measuring from a top surface of the second polysilicon layer.

Figure 7:
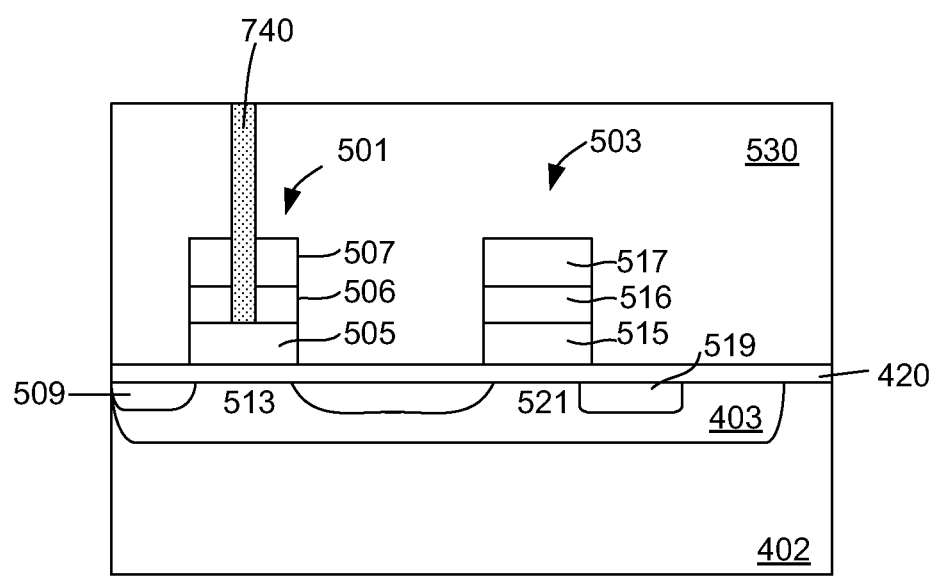

Referring to FIG. 6, an opening 640 is etched through the inter-metal layer dielectric material in a region of the select device up to the first polysilicon layer 505. A contact plug 740 is formed within the opening to connect the first polysilicon layer and the second polysilicon layer (FIG. 7). The plug can be made of a suitable material including tungsten, doped polysilicon, and others. In an embodiment, the total electrical resistivity of the electrical coupled portions of the first and second polysilicon layers is lower than the electrical resistivity of each individual portion of the first and second polysilicon layers. Depending upon the embodiment, other steps may be performed.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing memory devices, the method comprising:
    forming a well region in a substrate;
    forming a first polysilicon layer overlying the well region in the substrate;
    forming a dielectric layer overlying the first polysilicon layer;
    forming a second polysilicon layer overlying the dielectric layer to form a stack layer including the first polysilicon layer, dielectric layer, and second polysilicon layer;
    patterning the stack layer to simultaneously form a flash memory device and a select device, the flash memory device including a first portion of the second polysilicon layer overlying a first portion of the dielectric layer overlying a first portion of the first polysilicon layer, the select device including a second portion of the second polysilicon layer overlying a second portion of the dielectric layer overlying a second portion of the first polysilicon layer;
    forming an opening through the second portion of the second polysilicon layer and the second portion of the dielectric layer to expose a surface of the second portion of the first polysilicon layer, wherein the opening directly overlies an active channel region of the select device; and
    filling the opening with a conductive material to form a connection between the second portion of the second polysilicon layer and the second portion of the first polysilicon layer for the select device, while maintaining isolation between the first portion of the second polysilicon layer and the first portion of the first polysilicon layer for the flash memory device;
    whereupon the select device is configured to be activated by applying a voltage to the second portion of first polysilicon layer.

2. The method of claim 1 wherein the first polysilicon layer has a thickness ranging from about 1000 to about 2000 Angstroms, the dielectric layer has a thickness of about 50 to about 200 Angstroms, and the second polysilicon layer has a thickness ranging from about 1500 to about 2500 Angstroms.

3. The method of claim 1 wherein the dielectric layer comprises a first oxide layer overlying a nitride layer overlying a second oxide layer to form an ONO structure.

4. The method of claim 1 wherein the conductive material comprises tungsten.

5. The method of claim 1 wherein the substrate is a silicon substrate.

6. The method of claim 1 wherein the second portion of the first polysilicon layer and the second portion of the second polysilicon layer are electrically connected to form a single conductor structure for the select device.

7. The method of claim 1 wherein the flash memory device is coupled to the select device through a source/drain region.

8. The method of claim 1 wherein:
    the flash memory device comprises a tunnel oxide layer between the first portion of the first polysilicon layer and the well region;
    the select device comprises a gate oxide layer between the second portion of the first polysilicon layer and the well region;
    wherein the gate oxide layer has a different thickness than the tunnel oxide layer.

9. The method of claim 1 further comprising in-situ doping the first and second polysilicon layers using an impurity having a concentration of about $10^{20}$ atoms/cm$^3$.

10. The method of claim 9 wherein the impurity comprises one of phosphorous and arsenic.

11. The method of claim 1 further comprising:
    forming an insulating layer over the well region, the flash memory device, and the select device.

12. The method of claim 11 wherein the insulating layer has a thickness in a range from 400 Angstroms to 3000 Angstroms that is measured from a top surface of the second polysilicon layer.

13. The method of claim 11 wherein the insulating layer comprises silicon oxide.

14. The method of claim 11 wherein forming the opening comprises etching through the insulating layer in a region of the opening; and the filling the opening comprises forming a conductive plug within the opening.

15. The method of claim 14 wherein the plug includes tungsten.

16. The method of claim 14 wherein the plug includes polysilicon.

17. The method of claim 1 further comprising:
    after patterning the stack layer and prior to forming the opening, performing ion implantation on the well region to form a source region and a drain region for the select device and a source region and a drain region for the flash memory device, wherein the source region of the select device and the drain region of the flash memory device share a common ion implanted region.

18. The method of claim 17 wherein the ion implantation is performed with phosphorous having a dose in a range from $10^{12}$ to $10^{14}$ ions/cm$^2$ with an energy of 40 to 80 keV.

19. A method of manufacturing memory devices, the method comprising:
    forming a well region in a substrate;
    forming a first polysilicon layer overlying the well region in the substrate;
    forming a dielectric layer overlying the first polysilicon layer;
    forming a second polysilicon layer overlying the dielectric layer to form a stack layer including the first polysilicon layer, the dielectric layer, and the second polysilicon layer;
    patterning the stack layer to simultaneously form a flash memory device and a select device, the flash memory device including a first portion of the second polysilicon layer overlying a first portion of the dielectric layer overlying a first portion of the first polysilicon layer, the select device including a second portion of the second polysilicon layer overlying a second portion of the dielectric layer overlying a second portion of the first polysilicon layer;

forming an insulating layer over the well region, the flash memory device, and the select device, wherein the insulating layer has a thickness in a range from 400 Angstroms to 3000 Angstroms that is measured from a top surface of the second polysilicon layer;

forming an opening through the insulating layer, the second portion of the second polysilicon layer, and the second portion of the dielectric layer to expose a surface of the second portion of the first polysilicon layer, wherein the opening directly overlies an active channel region of the select device; and filling the opening with a conductive material to form a connection between the second portion of the second polysilicon layer and the second portion of the first polysilicon layer for the select device, while maintaining isolation between the first portion of the second polysilicon layer and the first portion of the first polysilicon layer for the flash memory device;

whereupon the select device is configured to be activated by applying a voltage to the second portion of first polysilicon layer.

* * * * *